United States Patent [19]

Kang et al.

[11] Patent Number: 5,244,830
[45] Date of Patent: Sep. 14, 1993

[54] METHOD FOR MANUFACTURING A SEMICONDUCTOR SUBSTRATE HAVING A COMPOUND SEMICONDUCTOR LAYER ON A SINGLE-CRYSTAL SILICON WAFER

[75] Inventors: Sang-Won Kang; Kyoung-Soo Lee, both of Daejeon, Rep. of Korea

[73] Assignee: Korea Electronics and Telecommunications Research Institute, Daejeon, Rep. of Korea

[21] Appl. No.: 883,864
[22] Filed: May 15, 1992

[30] Foreign Application Priority Data

May 16, 1991 [KR] Rep. of Korea ............... 91-7963

[51] Int. Cl.⁵ ............................................. H01L 21/20
[52] U.S. Cl. ...................................... 437/132; 437/5; 437/228; 437/234; 148/DIG. 149
[58] Field of Search ................... 437/228, 67, 5, 132, 437/61, 234; 148/DIG. 149

[56] References Cited

U.S. PATENT DOCUMENTS

| | | | |
|---|---|---|---|
| 4,891,329 | 1/1990 | Reisman et al. | 437/132 |
| 5,011,550 | 4/1991 | Konushi et al. | 437/132 |
| 5,064,781 | 11/1991 | Cambou et al. | 437/132 |
| 5,145,793 | 9/1992 | Oohara et al. | 437/5 |

FOREIGN PATENT DOCUMENTS

| | | | |
|---|---|---|---|
| 0066813 | 4/1985 | Japan . | |
| 0090518 | 4/1989 | Japan | 437/132 |

Primary Examiner—Brian E. Hearn
Assistant Examiner—Trung Dang
Attorney, Agent, or Firm—Larson and Taylor

[57] ABSTRACT

There is disclosed a method for manufacturing a semiconductor substrate having a compound semiconductor layer on a single-crystal silicon wafer, the method comprising the steps: sequentially forming first and second compound semiconductor epitaxial layers on a compound semiconductor wafer; forming a first silicon oxide layer on the second compound semiconductor epitaxial layer at a predetermined low temperature and depositing a poly-crystal silicon layer on the first silicon oxide layer; removing portions of the larminated layers by using a etching technique to form grooves on the compound semiconductor wafer; depositing a second silicon oxide layer overlying thereon at a predetermined low temperature; etching back horizontal portions of the second silicon oxide layer to form side walls in each of the grooves and polishing the polysilicon layer to form a planar surface thereon; bonding the planar surface and the single-crystal silicon wafer by using a thermal process technique; removing the compound semiconductor wafer by using a polishing process technique to expose the first compound semiconductor epitaxial layer; and etching back the first compound semiconductor epitaxial layer and the side walls to form the semiconductor substrate.

12 Claims, 3 Drawing Sheets

METHOD FOR MANUFACTURING A SEMICONDUCTOR SUBSTRATE HAVING A COMPOUND SEMICONDUCTOR LAYER ON A SINGLE-CRYSTAL SILICON WAFER

BACKGROUND OF THE INVENTION

1. Field of the Invention

The present invention relates to a method for manufacturing a semiconductor substrate having a compound semiconductor layer on a single-crystal silicon layer, and more particularly to a method for manufacturing a semiconductor substrate in which a compound semiconductor layer having an uniform thickness is formed on a single-crystal silicon wafer, so that an interface stress due to a difference in coefficients of thermal expansion between the silicon wafer and a compound semiconductor wafer is reduced by a stress absorbing means to prevent the two bonded wafers from separating.

2. Description of the Prior Art

A prior art method for manufacturing a semiconductor substrate in which a compound semiconductor layer composed of GaAs, InP or the like is formed on a single-crystal silicon wafer is described by V. Lehmann, K. Mitani, R. Stengl, T. Mii, and U. Gosele, "Bubble-free wafer bonding of GaAs and InP on silicon in a microcleanroom", Applied Physics Letters, Vol. 28, No. 12, pages 2141-2143, November 1989.

In such a prior art, since a silicon layer (as a single-crystal silicon wafer) and a GaAs layer (as a compound semiconductor wafer), or a silicon layer (as a single-crystal silicon wafer) and an InP layer (as a compound semiconductor wafer) are different in coefficient of thermal expansion therebetween, there occurs a problem that the two layers bonded by a thermal process is separated from each other at a temperature of 160° C. and more. Separating of the two layers is for lack of an absorbing means for absorbing an interface stress caused by difference in coefficient of thermal expansion therebetween.

SUMMARY OF THE INVENTION

It is, therefore, an object of the present invention to provide a method for manufacturing a semiconductor substrate in which a compound semiconductor wafer bonded with a single-crystal silicon wafer by using any of well-known thermal process techniques is provided with an absorbing means so as to reduce an interface stress caused by a difference in coefficients of thermal expansion between their wafers and to prevent separating of the bonded wafers at any high temperature in a thermal process.

It is other object of the present invention to provide a manufacturing method of a semiconductor substrate in which, after bonding a single-crystal silicon wafer and a compound semiconductor wafer by using a thermal process, the compound semiconductor wafer having an uniform thickness is formed on the silicon wafer at the completion of a polishing process.

According to one aspect of the present invention, a method for manufacturing a semiconductor substrate having a compound semiconductor layer on a single-crystal silicon wafer comprising the steps of:

sequentially forming first and second compound semiconductor epitaxial layers on a compound semiconductor wafer;

forming a first silicon oxide layer on the second compound semiconductor epitaxial layer at a predetermined low temperature and depositing a poly-crystal silicon layer on the first silicon oxide layer;

removing portions of the larminated layers by using a etching technique to form grooves on the compound semiconductor wafer;

depositing a second silicon oxide layer overlying thereon at a predetermined low temperature;

etching back horizontal portions of the second silicon oxide layer to form side walls in each of the grooves and polishing the poly-crystal silicon layer to form a planar surface thereon;

bonding the planar surface and the single-crystal silicon wafer by using a thermal process technique;

removing the compound semiconductor wafer by using a polishing process technique to expose the first compound semiconductor epitaxial layer; and etching back the first compound semiconductor epitaxial layer and the side walls to form the semiconductor substrate.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT(S)

Figure 1A:
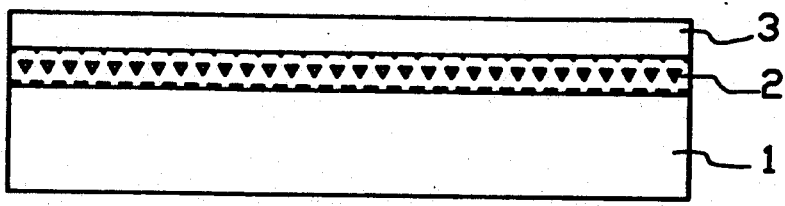
FIGS. 1A to 1H are cross-sectional views showing steps for manufacturing a semiconductor substrate in accordance with an embodiment of the present invention.

FIG. 1A shows a process step for forming two compound semiconductor epitaxial layers doped with an impurity of different concentrations on a compound semiconductor wafer. In FIG. 1A, on a compound semiconductor wafer 1 are sequentially formed first and second compound semiconductor epitaxial layers 2 and 3. A concentration of an impurity doped into the first compound semiconductor epitaxial layer 2 is different from that of an impurity doped into the second compound semiconductor epitaxial layer 3.

Figure 1B:
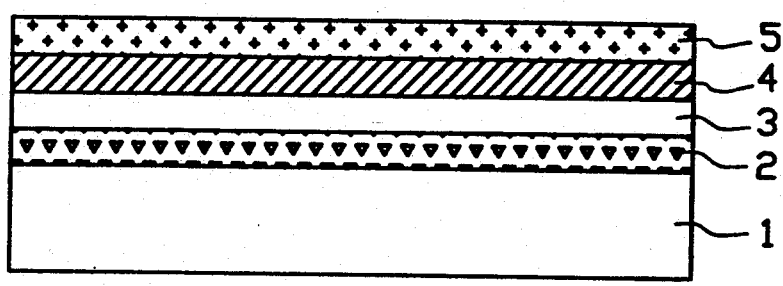

FIG. 1B shows a process step for forming a silicon oxide layer and a poly-crystal silicon layer on the second compound semiconductor epitaxial layer. With respect to FIG. 1B, a first silicon oxide layer 4 having a predetermined thickness is formed on the epitaxial layer 3 at a predetermined low temperature, and then a poly-crystal silicon layer 5 having a predetermined thickness is deposited on the first silicon oxide layer 4. The poly-crystal silicon layer 5 serves as a bonding layer for contact the compound semiconductor wafer and a single-crystal silicon wafer.

Figure 1C:
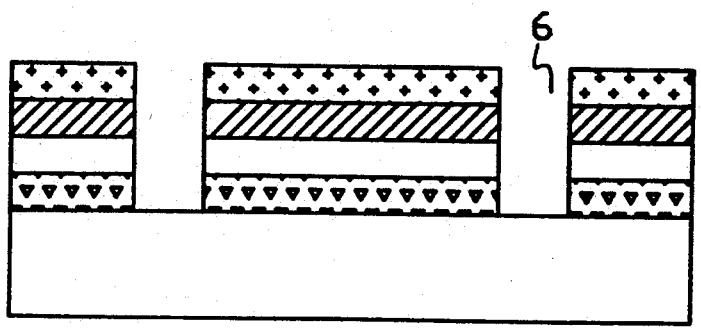

FIG. 1C shows a process step for making grooves on the compound semiconductor wafer. In FIG. 1C, by using any of well-known photo etching process techniques, the larminated layers 5,4,3 and 2 are removed from the compound semiconductor wafer 1 in turn to form grooves 6 on the wafer 1. Each of the grooves 6 is made of a mesa structure in which the grooves are arranged in matrix of row and column on the wafer 1.

Figure 2:
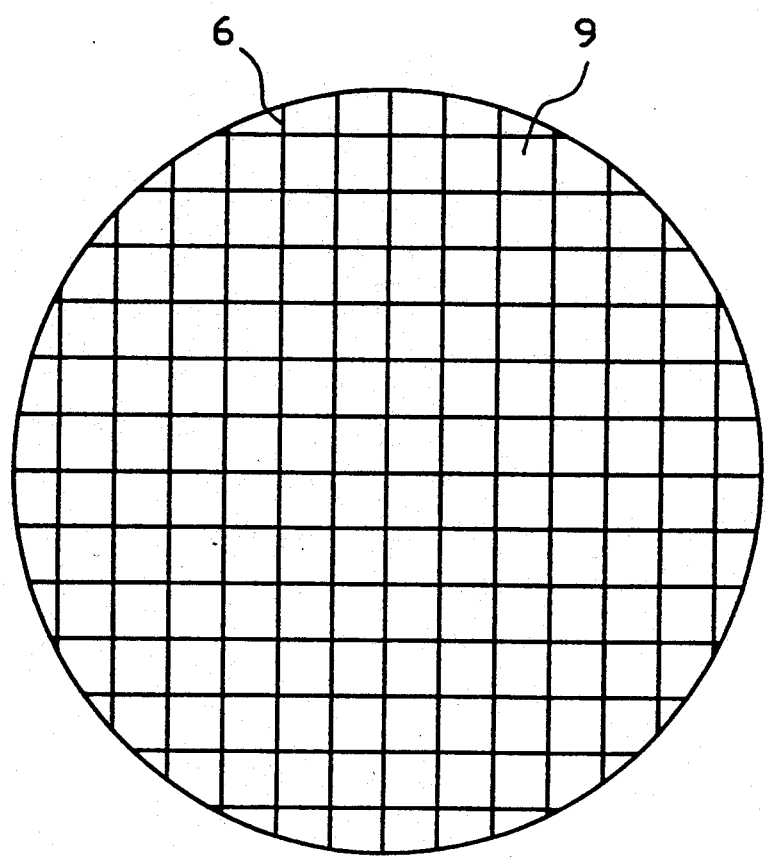
FIG. 2 is a plane view of the semiconductor substrate manufactured by the present invention.

Referring to FIG. 2, solid lines indicate grooves 6 for absorbing an interface stress caused by a difference in coefficients of thermal expansion between the wafers, and rectangular shapes defined by the grooves indicate semiconductor substrates 9. Depth of each of the grooves 6 is controlled by thickness of a compound semiconductor layer to be formed on the single-crystal silicon wafer. Also, the grooves 6 are used as scribe lines.

Figure 1D:
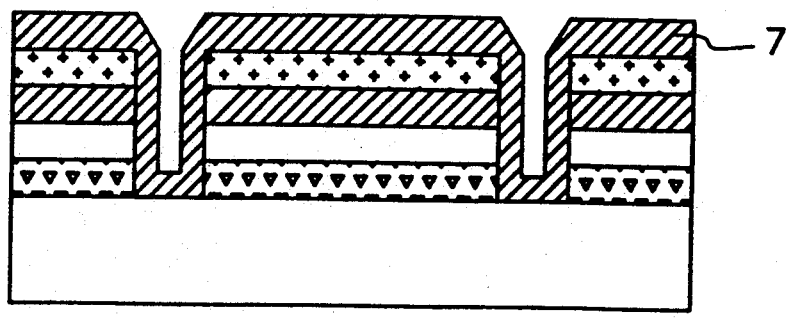

FIG. 1D shows a process step for depositing a silicon oxide layer. In FIG. 1D, a second silicon oxide layer 7 of a predetermined thickness is formed overlying the wafer 1 and the grooves 6 at a low temperature.

Figure 1E:
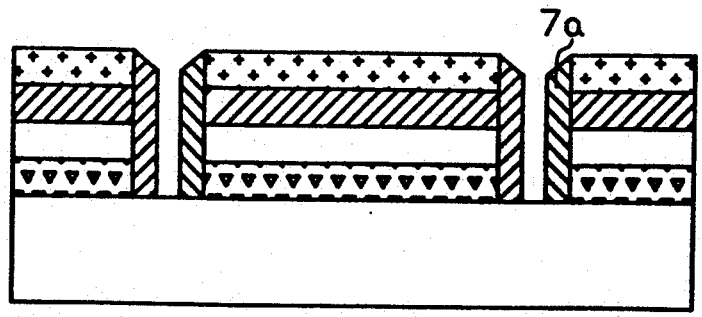

FIG. 1E shows a process step for forming side walls in each of the grooves. With respect to FIG. 1E, by using any of well-known dry-etching techniques, only horizontal potions of the second silicon oxide layer 7 are etched back to form side walls 7a in each of the grooves 6. The side walls 7a preserve dopant (such as arsenic or the like) injected into the second compound semiconductor epitaxial layer from escaping. In addition, the poly-crystal silicon layer 5 is polished to form a planar surface thereon.

Figure 1F:
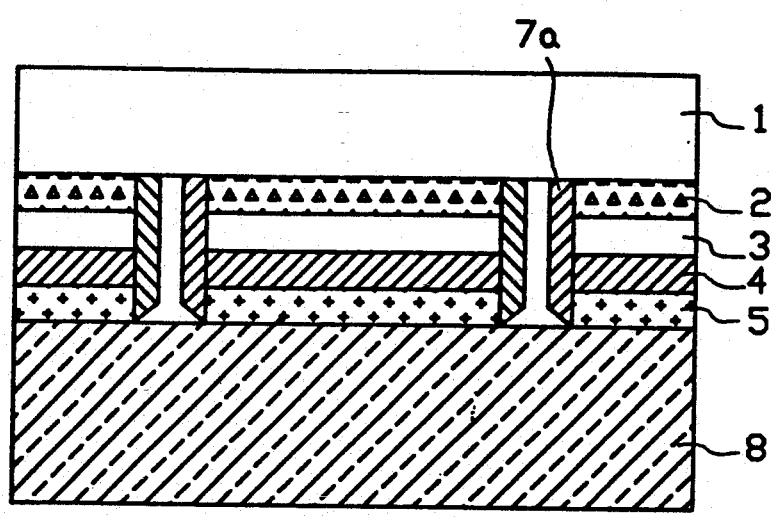

FIG. 1F shows a process step for bonding the wafers. In FIG. 1F, the compound semiconductor wafer 1 in contact with the single-crystal silicon wafer 8 is subjected to a thermal process: maintaining the wafers at a temperature of 100° C. to 1100° C. for boding the planar surface of the poly-crystal silicon layer 5 and the surface of the silicon wafer 8.

In the thermal process, the grooves 6 between both the side walls are used for absorbing an interface stress caused by a difference in coefficients of thermal expansion between the wafers in a thermal process to be followed up.

Figure 1G:
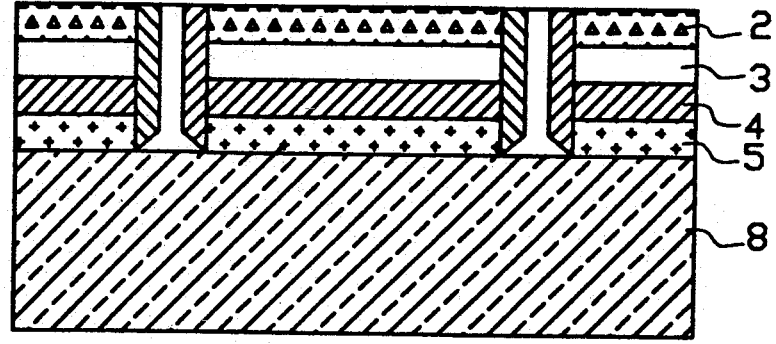

FIG. 1G shows a process step for removing the compound semiconductor wafer 1. In FIG. 1G, the wafers 1 and 8 thus bonded are subjected to a polishing process: firstly, thinning the compound semiconductor wafer 1 by using any of well-known mechanical polishing techniques in the art so as to leave the compound semiconductor wafer of a thickness about 30 µm, and secondly etching back all the remaining compound semiconductor wafer by using any of well-known chemical etching techniques so as to expose the first compound semiconductor epitaxial layer 2.

Figure 1H:
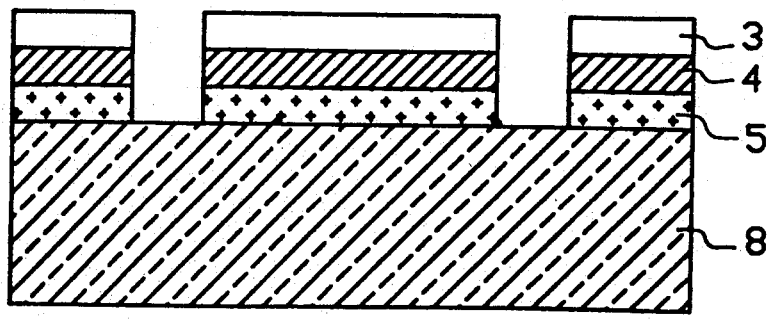

FIG. 1H shows a process step for forming a compound semiconductor layer. With respect to FIG. 1H, the first compound semiconductor epitaxial layer 2 is removed by a selectively etching process technique as well-known in the art, and then the side walls 7a are removed by any of well-known wet etching techniques in the art so as to expose the second compound semiconductor epitaxial layer 3. Accordingly, manufacturing of the semiconductor substrate 9 provided with the compound semiconductor layer on the single-crystal silicon layer is completed.

In the embodiment of the invention as described above, a poly-crystal silicon layer is used for bonding two wafers, however, the poly-crystal silicon layer can be substituted for an amorphous silicon layer.

In addition, the embodiment describes a manufacturing method of a semiconductor substrate provided with a compound semiconductor layer composed of compound semiconductor epitaxial layers having a two-storied epitaxial structure, however, the embodiment can be applied to a method for manufacturing a semiconductor substrate provided with a compound semiconductor layer composed of compound semiconductor epitaxial layers having at least three-storied structure in order to form a photo cell.

On the other hand, the thermal process as described in the embodiment can be substituted for the following thermal process: firstly two wafers contacted with each other is bonded at a low temperature preferably 300° C., and secondly after performing of a thinning process the two wafers thus bonded are kept at a temperature of 100° C. to 1100° C.

Since the semiconductor substrate manufactured by the method according to the present invention is provided with grooves as a stress absorbing means, the substrate can absorb an interface stress caused by a difference in coefficients of thermal expansion between the compound semiconductor wafer and the single-crystal silicon wafer to prevent the bonded wafers from separating at a high temperature.

Moreover, since one of two compound semiconductor epitaxial layers doped with an impurity of different concentrations may be etched back by a selectively etching process, the compound semiconductor layer having an uniform thickness can be formed on a single-crystal silicon wafer.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for manufacturing a semiconductor substrate having a compound semiconductor layer on a single-crystal silicon wafer comprising the steps of:
   sequentially forming first and second semiconductor epitaxial layers on a compound semiconductor wafer;
   forming a first silicon oxide layer on the second compound semiconductor epitaxial layer at a low temperature and depositing a poly-crystal silicon layer on the first silicon oxide layer to form laminated layers;
   removing portions of the larminated layers by using a etching technique to form grooves on the compound semiconductor wafer;
   depositing a second silicon oxide layer overlying thereon at a low temperature;
   etching back horizontal portions of the second silicon oxide layer to form side walls in each of the grooves and polishing the polysilicon layer to form a planar surface thereon;
   bonding the planar surface and the single-crystal silicon wafer by using a thermal process technique;
   removing the compound semiconductor wafer by using a polishing process technique to expose the first compound semiconductor epitaxial layer; and
   etching back the first compound semiconductor epitaxial layer and the side walls to form the semiconductor substrate.

2. The method according to claim 1 wherein the compound semiconductor layer is composed of compound semiconductor epitaxial layers having at least three-storied structure.

3. The method according to claim 1 wherein concentrations of an impurity injected into the first and second compound semiconductor epitaxial layers are different from each other.

4. The method according to claim 1 wherein each of the grooves has a mesa structure in which the grooves are arranged in matrix on the compound semiconductor wafer.

5. The method according to claim 1 wherein the side walls prevent dopant injected into the second semiconductor epitaxial layer from escaping.

6. The method according to claim 1 wherein the grooves absorb an interface stress caused by a difference in coefficients of thermal expansion between the wafers.

7. The method according to claim 1 wherein the thermal process for bonding is carried out at a temperature of 100° C. to 1100° C.

8. The method according to claim 1 wherein thermal process for bonding is carried out firstly at about 300° C. and secondly at a temperature of 100° C. to 1100° C.

9. The method according to claim 1 wherein an amorphous silicon layer is substituted for a bonding layer to be in contact with the single-crystal silicon wafer.

10. The method according to claim 1 wherein in the polishing process for removing the compound semiconductor wafer, firstly a mechanical polishing process is carried out to thin the compound semiconductor wafer of a thickness about 30 μm, and secondly a wet etching process is carried out to remove all the remaining semiconductor wafer.

11. The method according to claim 1 wherein the first compound semiconductor epitaxial layer is removed by a selectively etching process.

12. The method according to claim 1 wherein the side walls are removed by a wet etching process.

* * * * *